United States Patent

Gerung et al.

[11] Patent Number: 5,930,646
[45] Date of Patent: Jul. 27, 1999

[54] METHOD OF SHALLOW TRENCH ISOLATION

[75] Inventors: Henry Gerung, Malang, Indonesia; Igor V. Peidous, Singapore, Singapore; Thomas Schuelke, Ann Arbor, Mich.; Andrew Kuswatno, Blangan, Indonesia

[73] Assignee: Chartered Semiconductor Manufacturing, Ltd., Singapore, Singapore

[21] Appl. No.: 09/169,435

[22] Filed: Oct. 9, 1998

[51] Int. Cl.$^6$ ................................. H01L 21/76
[52] U.S. Cl. .................. 438/431; 438/224; 438/427; 257/50
[58] Field of Search .................. 438/224, 427, 438/231, 431; 257/50

[56] References Cited

U.S. PATENT DOCUMENTS

| | | | |
|---|---|---|---|
| 5,130,268 | 7/1992 | Liou et al. | 438/424 |
| 5,212,114 | 5/1993 | Grewal et al. | 437/192 |
| 5,316,965 | 5/1994 | Philipossian et al. | 438/424 |
| 5,346,584 | 9/1994 | Nasr et al. | 156/636 |
| 5,410,176 | 4/1995 | Liou et al. | 257/50 |
| 5,453,639 | 9/1995 | Cronin et al. | 257/510 |
| 5,643,836 | 7/1997 | Meister et al. | 437/228 |
| 5,721,172 | 2/1998 | Jang et al. | 438/424 |
| 5,728,621 | 3/1998 | Zheng et al. | 438/427 |
| 5,817,567 | 4/1997 | Jang et al. | 438/427 |
| 5,817,568 | 7/1997 | Chao | 438/427 |
| 5,851,899 | 8/1996 | Weigland | 438/457 |
| 5,872,043 | 7/1996 | Chen | 438/424 |
| 5,880,007 | 9/1997 | Varian et al. | 438/427 |

Primary Examiner—Charles Bowers
Assistant Examiner—David S Blum
Attorney, Agent, or Firm—George O. Saile; Rosemary L. S. Pike; William J. Stoffel

[57] ABSTRACT

The invention is an improved process for forming isolations of uniform thickness in narrow and wide trenches. The process begins by forming a pad layer on a semiconductor substrate. A first barrier layer is formed on the pad layer. The first barrier layer and pad layer are patterned forming openings, thereby exposing the substrate surface. The substrate is then etched through the openings to form shallow trenches in the substrate. The trenches generally falling into two ranges of width: narrow trenches having widths in the range between 0.3 $\mu$m and 1.0 $\mu$m; and wide trenches having widths greater than 1.0 $\mu$m. A thin oxide film is grown on the sidewalls and bottoms of the trenches. A gap-fill dielectric layer is formed on the thin oxide film. A polysilicon layer is grown on the gap-fill dielectric layer. The polysilicon layer acts as a stop during CMP, providing additional protection of the gap-fill dielectric layer in the wide trenches. A planarizing material layer is formed on the polysilicon layer. The planarizing material layer, polysilicon layer and gap-fill dielectric layer are planarized to the level of the first barrier layer using chemical mechanical polishing (CMP). The residual planarizing material is then stripped. The polysilicon layer is oxidized forming a novel second dielectric oxide layer in an oxidizing atmosphere. The dielectric layer is densified, preferably in the same oxidizing atmosphere, forming an isolation layer with uniform thickness in the narrow trenches and the wide trenches. The stress developed during conversion of the polysilicon layer to a novel second dielectric oxide layer compensates for the stress due to densification of the dielectric layer.

12 Claims, 3 Drawing Sheets

METHOD OF SHALLOW TRENCH ISOLATION

BACKGROUND OF THE INVENTION

1. Field of the Invention

This invention relates generally to a method for fabrication of shallow trench isolation. More specifically, this invention relates to a method of compensating for the difference in dielectric thickness between narrow trenches and wide trenches.

2. Description of the Related Art

The most important factor that ensures the quality of shallow trench isolation is the dielectric used for isolation and its uniformity across multiple trenches. Circuit design considerations will frequently require varying trench widths. There is a need for a cost-effective process to fill these trenches of varying widths with a dielectric of uniform thickness.

One current method is to fill the trenches with oxide using CVD. The resulting gap-fill oxide layer is then planarized using CMP as is well known by one skilled in the art. The problem with this process is that the oxide layer will be polished at a higher rate in wide trenches resulting in the phenomenon known as "dishing." The dielectric thickness in wide trenches will be less than the dielectric thickness in narrow trenches resulting in a different capacitance and a faster device deterioration.

Another current method of fabricating shallow trench isolation is to use a photoresist mask inverse to the structured layer to be planarized then back-etch as is disclosed by U.S. Pat. No. 5,212,114 (Grewal et al.). The problem with this method is that the added steps of inverse masking and back-etching are difficult and expensive.

U.S. Pat. No. 5,453,639 (Cronin et al.) discloses a planarization processcomprising oxidizing Si particles and CMP.

U.S. Pat. No. 5,346,584 (Nasr et al.) discloses a method of planarizing an isolation using a polysilicon layer that is oxidized.

U.S. Pat. No. 5,643,836 (Meister et al.) discloses a planarizing method using etch back techniques.

The closest and aparently more relevant technical developments in the patent literature can be gleaned by considering the aforementioned patents.

SUMMARY OF THE INVENTION

It is an object of the present invention to provide a method for fabricating isolation dielectric layers that fills narrow and wide shallow trenches with uniform dielectric thickness.

It is another object of this invention to minimize the erosion of the deposited dielectric layer during CMP.

It is yet another object of the present invention to compensate for the stress induced by densification of the gap-fill dielectric layer.

To accomplish the above objectives, the present invention provides a method of shallow trench isolation on a semiconductor substrate. The method comprises forming a pad layer (12) on a semiconductor substrate (10). A first barrier layer (14) is formed on the pad layer (12). The first barrier layer (14) and pad layer (12) are patterned forming openings, thereby exposing the substrate (10) surface. The substrate (10) is then etched through the openings to form shallow trenches (20, 22) in the substrate (10). The trenches generally falling into two ranges of width: narrow trenches (20) having widths in the range between 0.3 $\mu$m and 1.0 $\mu$m; and wide trenches (22) having widths greater than 1.0 $\mu$m. A thin oxide film (28) is grown on the sidewalls and bottoms of the trenches. A gap-fill dielectric layer (30) is formed on the thin oxide film (28). A polysilicon layer (32) is grown on the gap-fill dielectric layer (30). The polysilicon layer (32) acts as a stop during CMP, providing additional protection of the gap-fill dielectric layer (30) in the wide trenches. A planarizing material layer (34) is formed on the polysilicon layer (32). The planarizing material layer (34), polysilicon layer (32) and gap-fill dielectric layer (30) are planarized to the level of the first barrier layer (14) using chemical mechanical polishing (CMP). The residual planarizing material (34) is then stripped. The polysilicon layer (32) is oxidized forming a novel second dielectric oxide layer (32A) in an oxidizing atmosphere. The dielectric layer (30) is densified, preferably in the same oxidizing atmosphere, forming an isolation layer with uniform thickness in the narrow trenches (50) and the wide trenches (52). The stress developed during conversion of the polysilicon layer (32) to a novel second dielectric oxide layer (32A) compensates for the stress due to densification of the dielectric layer (30). The first barrier layer (14) is removed. The pad layer (12) is removed.

DETAILED DESCRIPTION OF THE PREFERRED EMBODIMENTS

The present invention will be described in detail with reference to the accompanying drawings. The present invention provides a method of forming shallow trench isolations 50, 52 with uniform thickness on a semiconductor substrate 10.

Figure 1:
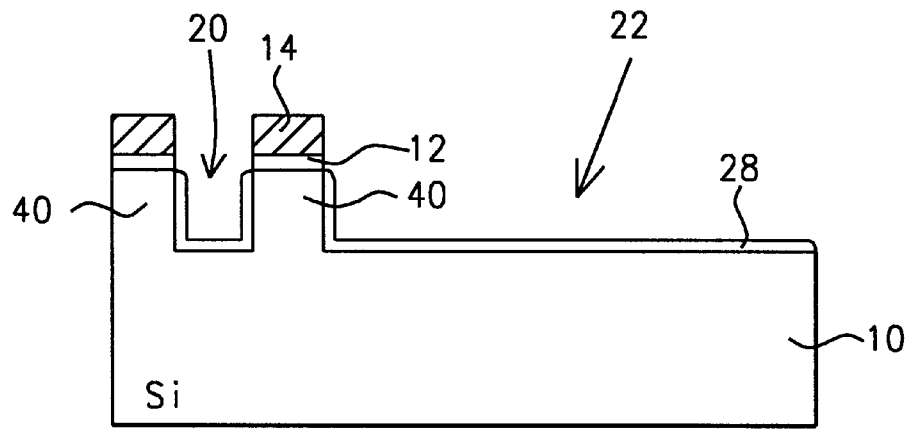
FIG. 1, FIG. 2, FIG. 3, FIG. 4, FIG. 5 and FIG. 6 are cross-sectional views illustrating the present invention.

The method begins by forming a pad layer 12 over a semiconductor substrate 10 as shown in FIG. 1. The pad layer 12 can comprise of an oxide layer. Alternatively, the pad layer 12 can comprise of a combination of polysilicon and oxide layers. Preferably the pad layer is composed of oxide (e.g., pad oxide layer). The pad oxide layer 12 is preferably composed of silicon oxide having a thickness in a range of between about 150 Å and 600 Å. The pad oxide layer is preferably formed using a thermal oxidation process.

Still referring to FIG. 1, a first oxidation barrier layer 14 is formed over the pad oxide layer 12. The first oxidation barrier layer can be composed of any material or combination of materials that block oxygen diffusion, such as silicon nitride or oxynitride. The first barrier layer 14 is preferably composed of silicon nitride having a thickness in the range of between about 1000 Å and 2000 Å. The silicon nitride layer 14 can be formed by reacting silane and ammonia at atmospheric pressure at 700° C. to 900° C., or by reacting dichlorosilane and ammonia at reduced pressure at approximately 700° C. (LPCVD). Also, silicon nitride can be formed by plasma enhance chemical vapor deposition by reacting silane with ammonia or nitrogen in a glow discharge between 200° C. and 350° C. The first nitride layer is preferably formed using a LPCVD process.

As shown in FIG. 1, the first oxidation barrier layer 14 and the pad layer 12 are patterned, forming openings thereby exposing the substrate surface using a photolithography process as is well known in the art. The openings define the trenches 20, 22 where isolation layers will be formed and active areas 40, where semiconductor devices will be formed. A thin oxide 28 film is formed on the sidewalls and bottoms of the trenches 20, 22. The oxide film 28 is preferably formed to a thickness in the range between about 50 Å and 400 Å° by a thermal oxidation process at a temperature between 900 C and 1100° C. at atmospheric pressure for a time between about 9 minutes and 11 minutes.

Figure 2:
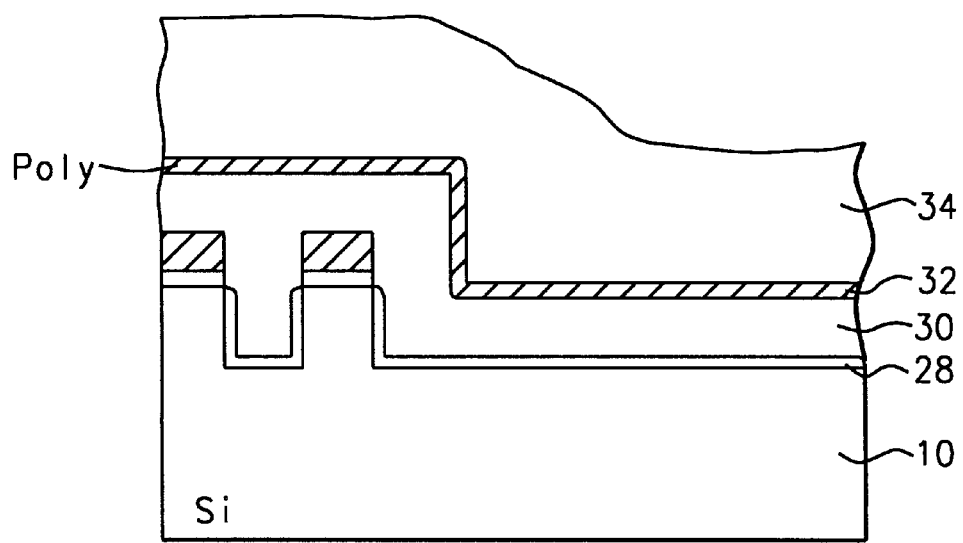

Referring to FIG. 2, a gap-fill dielectric layer 30 is formed on the thin oxide film 28 and on the barrier layer 14. Preferably, the gap-fill dielectric layer 30 is formed to a thickness in a range between about 2000 Å and 4000 Å. The dielectric thickness is specified in the wide trenches because they exhibit enhanced oxide thinning during CMP. The specified thickness is approximately equal to the depth of the trenches in the substrate.

As shown in FIG. 2, a polysilicon layer 32 is formed on the dielectric layer 30. The polysilicon layer is formed to a thickness between 0.05 $\mu$m and 0.2 $\mu$m, preferably about 0.1 $\mu$m. The polysilicon can be formed by a low pressure chemical vapor deposition process (LPCVD) by pyrolyzing silane at a temperature in the range between about 575° C. and 650° C. in a low pressure reactor at a pressure in a range between about 25 Pa and 130 Pa. In the preferred embodiment, the polysilicon layer 32 acts as a stop during CMP, providing additional protection of the dielectric layer 30 in wide trenches.

A planarizing material layer 34 is formed on the polysilicon layer. The planarizing material can be spin on glass (SOG), CVD oxides, or spin on polymer (SOP), most preferably spin on glass (SOG). The thickness of the planarizing layer is greater than the step height in the active areas, preferably in a range between about 3000 Å and 7000 Å. (The step height in the active areas being the combination of the depth of the trenches 20, 22 plus the thicknesses of the pad layer 12 and the barrier layer 14.)

Figure 3:
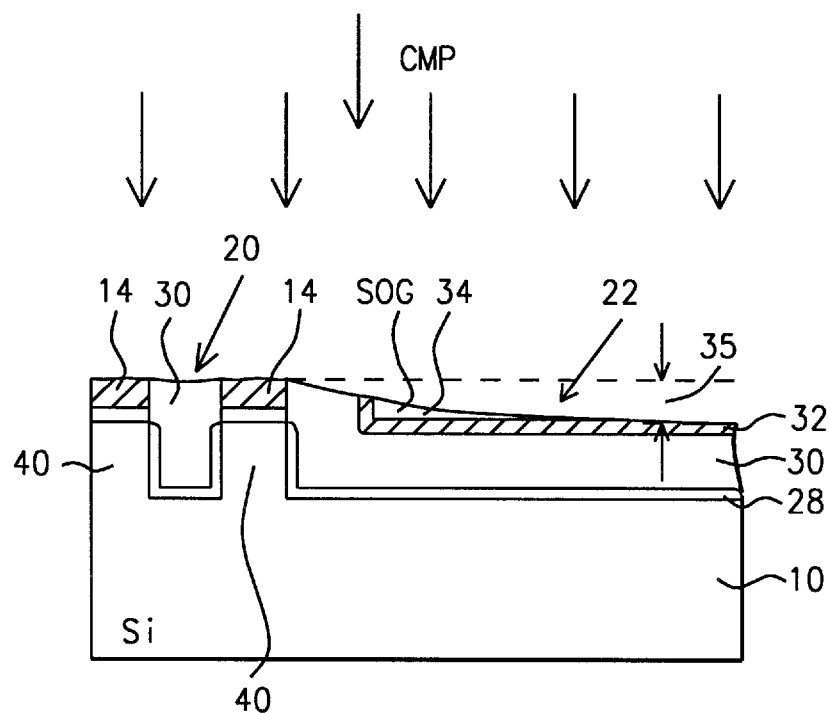

Referring to FIG. 3, the planarizing material layer 34, polysilicon layer 32 and gap-fill dielectric layer 30 are planarized to the level of the first barrier layer 14 using a chemical mechanical polishing process (CMP) as is well known in the art. As shown in FIG. 3, the CMP process removes the polysilicon layer 32 over the active areas 40 and narrow trenches 20 leaving the polysilicon layer 32 only over the wide trenches 22. The CMP process leaves a unitary depression 35 (e.g., CMP dishing) over the wide trenches having a depth in a range between about 500 Å and 1000 Å.

Figure 4:
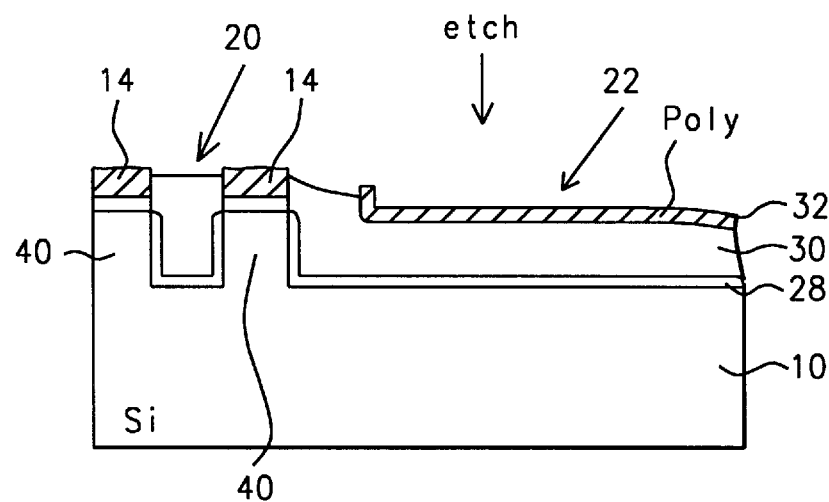

Referring to FIG. 4, the residual planarizing material 34 is then stripped using a selective etch process as is well known in the art.

Figure 5:
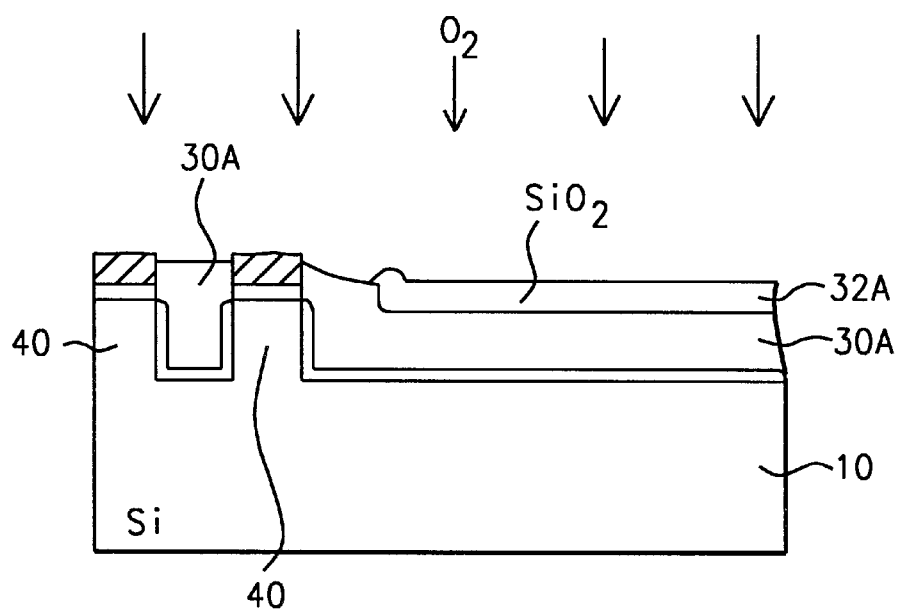

Referring to FIG. 5, the polysilicon layer 32 is oxidized forming a novel second dielectric oxide layer 32A in an oxidizing atmosphere. The oxidizing atmosphere is composed of between 40% and 50% $O_2$, between 0% and 60% $H_2$ and between 0% and 50% $N_2$. Preferably, the polysilicon layer is oxidized at a temperature in the range between about 800° C. and 1100° C. at a pressure between 710 Torr and 810 Torr. The oxidizing step is performed for a sufficient period of time to ensure total oxidation of the polysilicon layer 32. This time can be calculated based on the thickness of polysilicon and oxidation temperature and ambience.

Still referring to FIG. 5, the gap-fill dielectric layer 30 is densified forming a densified gap-fill dielectric layer 30A. Preferably, the polysilon layer 32 is oxidized and the gap-fill dielectric layer 30 is densified in the same processing step. Combining the oxidation and densification steps provides processing efficiency. Also, the stress developed during conversion of the polysilicon layer 32 to a novel dielectric oxide layer 32A gradually compensates for the stress due to densification of the gap-fill dielectric layer 30 into a densified gap-fill dielectric layer 30A.

Figure 6:
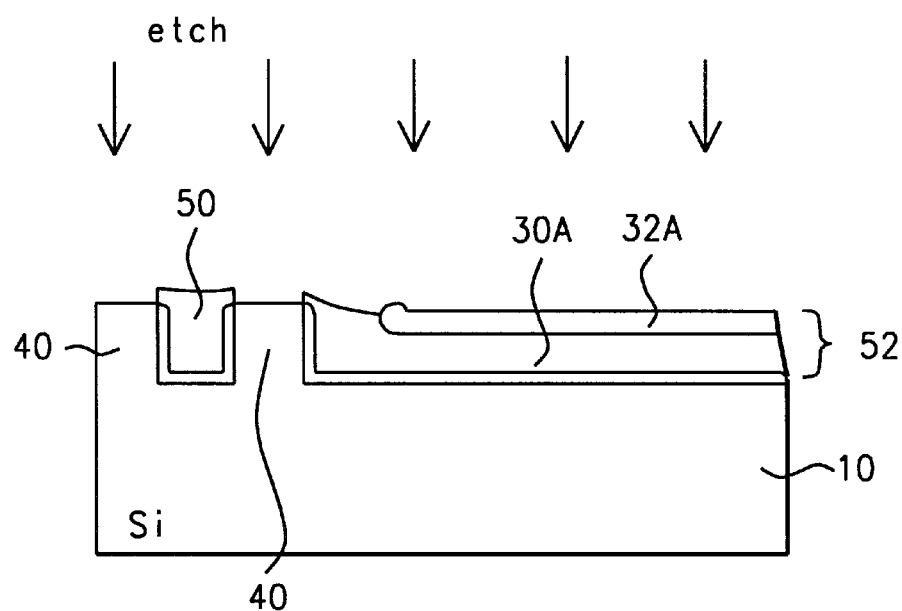

Referring to FIG. 6, the first barrier layer 14 and the pad layer 12 are removed, preferably by selective etching processes, as are well known in the art. As shown in FIG. 6, the resulting structure has active areas 40. The active areas 40 are separated by narrow trench isolations 50 and wide trench isolations 52, having uniform thickness. The narrow trench isolations 50 consist of a densified dielectric layer 30A. The wide trench isolations 52 consist of a novel second dielectric layer 32A over a densified gap-fill dielectric layer 30A. Thereafter, semiconductor devices can be formed on the active areas 40 as is well known in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of shallow trench isolations on a semiconductor device comprising the steps of:

a) forming a first barrier layer over a semiconductor substrate;

b) patterning said first barrier layer;

c) etching said substrate through said openings to form trenches in said substrate; said trenches having bottoms and sidewalls, and wherein said trenches are comprised of narrow trenches having a width in a range between about 0.3 $\mu$m and 1.0 $\mu$m, and wide trenches having a width greater than 1.0 $\mu$m;

d) forming an oxide film over said substrate in said bottoms and sidewalls of said trenches;

e) forming a gap-fill dielectric layer over said oxide film in said trenches;

f) forming a polysilicon layer on said gap-fill dielectric layer;

g) forming a planarizing material layer on said polysilicon layer;

h) planarizing said planarizing material layer, said polysilicon layer and said gap-fill dielectric layer to a level of the top of said first barrier layer;

i) removing said planarizing material; and j) oxidizing said polysilicon layer to form a second dielectric oxide layer.

2. The method of claim 1 wherein said gap-fill dielectric is deposited to a thickness between about 2000 and 4000 Å.

3. The method of claim 1 wherein said polysilicon layer is deposited to a thickness between 0.05 m and 0.2 $\mu$m.

4. The method of claim 1 wherein oxidation of said polysilicon layer is performed at a temperature between about 800 C and 1100° C.; at a pressure between 710 Torr and 810 Torr; in an atmosphere composed of between 40% and 50% $O_2$, between 0% and 60% $H_2$ and between 0% and 50% $N_2$ for a sufficient time to ensure total oxidation of said polysilicon layer.

5. The method of claim 1 which further includes forming a pad layer on said substrate prior to forming said first barrier layer.

6. A method of fabrication of shallow trench isolations on a semiconductor device comprising the steps of:

a) forming a pad layer on a semiconductor substrate;

b) forming a first barrier layer on said pad layer;

c) patterning said first barrier layer and said pad layer forming openings;

d) etching said substrate through said openings to form trenches in said substrate; said trenches having bottoms and sidewalls, and wherein said trenches are comprised of narrow trenches having a width in a range between about 0.3 µm and 1.0 µm, and wide trenches having a width greater than 1.0 µm;

e) forming an oxide film over said substrate on said bottoms and sidewalls of said trenches;

f) forming a gap-fill dielectric layer over said thin oxide film in said trenches;

g) forming a polysilicon layer on said gap-fill dielectric layer;

h) forming a planarizing material layer on said polysilicon layer;

i) planarizing said planarizing material layer, said polysilicon layer and said gap-fill dielectric layer to the top of said first barrier layer;

j) removing said planarizing material;

k) oxidizing said polysilicon layer to form a novel second dielectric oxide layer;

l) densifying said gap-fill dielectric layer to form a densified gap-fill dielectric layer;

m) removing said first barrier layer; and n) removing said pad layer.

7. The method of claim 6 wherein said gap-fill dielectric is deposited to a thickness between 2000 Å and 4000 Å.

8. The method of claim 6 wherein said polysilicon layer is deposited to a thickness between 0.05 µm and 0.2 µm.

9. The method of claim 6 wherein oxidation of said polysilicon layer and densification of said gap-fill dielectric layer is performed at a temperature between 800° C. and 1100° C.; at a pressure between 710 Torr and 810 Torr; in an atmosphere composed of between 40% and 50% $O_2$, between 0% and 60% $H_2$ and between 0% and 50% $N_2$, for a sufficient time to ensure total oxidation of said polysilicon layer.

10. A method of fabrication of shallow trench isolations on a semiconductor device comprising the steps of a) forming a pad layer on a semiconductor substrate;

b) forming a first barrier layer on said pad layer;

c) patterning said first barrier layer and said pad layer forming openings;

d) etching said substrate through said openings to form trenches in said substrate; said trenches having bottoms and sidewalls, and wherein said trenches are comprised of narrow trenches having a width in a range between about 0.3 µm and 1.0 µm, and wide trenches having a width greater than 1.0 µm;

e) forming an oxide film over said substrate on bottoms and sidewalls of said trenches;

f) forming a gap-fill dielectric layer over said oxide film in said trenches;

g) forming a polysilicon layer on said gap-fill dielectric layer;

h) forming a planarizing material layer on said polysilicon layer;

i) planarizing said planarizing material layer, said polysiticon layer and said gap-fill dielectric layer to the top of said first barrier layer;

j) removing said planarizing material;

k) simultaneously oxidizing said polysilicon layer to form a novel second dielectric oxide layer and densifying said gap-fill dielectric layer to form a densified gap-fill dielectric layer; the oxidation of said polysilicon layer and densification of said gap-fill dielectric layer performed at a temperature between 800° C. and 1 100° C.; at a pressure between 710 Torr and 810 Torr; in an atmosphere composed of between 40% and 50% O2, between 0% and 60% $H_2$ and between 0% and 50% $N_2$ for a sufficient time to ensure total oxidation of said polysilicon layer.

11. The method of claim 10 wherein said gap-fill dielectric is deposited to a thickness between 2000 Å and 4000 Å.

12. The method of claim 10 wherein said polysilicon layer is deposited to a thickness between 0.05 µm and 0.2 µm.

* * * * *